United States Patent
DeBoer et al.

(10) Patent No.: US 6,528,436 B1
(45) Date of Patent: Mar. 4, 2003

(54) METHOD OF FORMING SILICON NITRIDE LAYER DIRECTLY ON HSG POLYSILICON

(75) Inventors: Scott Jeffrey DeBoer, Boise, ID (US); Klaus Florian Schuegraf, Boise, ID (US); Randhir P. S. Thakur, Boise, ID (US); Robert K. Carstensen, Boise, ID (US)

(73) Assignee: Micron Technology. Inc., Boise, ID (US)

( * ) Notice: Subject to any disclaimer, the term of this patent is extended or adjusted under 35 U.S.C. 154(b) by 0 days.

(21) Appl. No.: 09/506,177

(22) Filed: Feb. 17, 2000

Related U.S. Application Data

(63) Continuation of application No. 08/734,357, filed on Oct. 21, 1996, now abandoned.

(51) Int. Cl.$^7$ ...................... H01L 21/31; H01L 21/8242
(52) U.S. Cl. ...................... 438/791; 438/253; 438/381; 438/396
(58) Field of Search ...................... 438/255, 791–792, 438/762–763, 702, 238–256, 287, 381, 386–399, 945; 148/DIG. 114

(56) References Cited

U.S. PATENT DOCUMENTS

| | | | |
|---|---|---|---|
| 4,279,947 A | 7/1981 | Goldman et al. | 427/255 |
| 4,529,621 A | 7/1985 | Ballard | 427/95 |
| 4,699,825 A | 10/1987 | Sakai et al. | 428/337 |
| 4,990,471 A | 2/1991 | Jain et al. | 501/97 |
| 5,032,545 A * | 7/1991 | Doan et al. | 438/396 |
| 5,043,780 A | 8/1991 | Fazan et al. | 357/23.6 |
| 5,068,199 A | 11/1991 | Sandhu | 437/52 |
| 5,138,411 A | 8/1992 | Sandhu | 357/23.6 |
| 5,227,322 A | 7/1993 | Ko et al. | 437/47 |
| 5,266,514 A | 11/1993 | Tuan et al. | 437/52 |
| 5,274,586 A | 12/1993 | Matsukawa | 365/149 |
| 5,290,729 A | 3/1994 | Hayashide et al. | 437/60 |
| 5,326,649 A | 7/1994 | Kashida et al. | 428/698 |
| 5,376,593 A | 12/1994 | Sandhu et al. | 437/242 |
| 5,378,645 A | 1/1995 | Inoue et al. | 437/47 |

(List continued on next page.)

OTHER PUBLICATIONS

Wolf"silicon processing for the VLSI Era" vol. 1 pp. 169–171, 191–194 1989.*
Inoue, N., et al., "The Selective Growth of LPCVD–Si3N4 on Cleaned Si Surface", *Extended Abstracts of the 1992 International Conference on Solid State Devices and Materials*, Tsukuba, VLSI Research and Development Laboratory, 3, (1992).
Wolf, "Silicon Processing for the VLSI ERA", *Process Integration*, vol. I, 169–171, (1989).
Wolf, S., "Silicon Processing for the VLSI Era", *Process Technology*, vol. 1, 190–195, (1986).

*Primary Examiner*—Tuan H. Nguyen
*Assistant Examiner*—Thanh Nguyen
(74) *Attorney, Agent, or Firm*—Schwegman, Lundberg, Woessner & Kluth, P.A.

(57) ABSTRACT

Silicon nitride layers, having thicknesses of 100 angstroms or less, are formed using chemical vapor deposition (CVD). Higher pressure and lower temperature deposition regimes are used to provide more uniform step coverage on complex topographies, such as hemispherical grain polysilicon. In one embodiment, a hot wall batch CVD processing apparatus utilizes a processing chamber pressure of at least as high as approximately 500 mTorr to deposit such films. In a second embodiment, a single wafer cold wall CVD processing apparatus utilizes a processing chamber pressure of approximately 1 to 600 Torr to deposit such films. The temperature range used to process such films is approximately 400 to 700 degrees Celsius. A mixture of ammonia ($NH_3$) and a silane gas, such as dichlorosilane (DCS), are reacted in any type of CVD apparatus to produce the films.

32 Claims, 6 Drawing Sheets

U.S. PATENT DOCUMENTS

| | | | |
|---|---|---|---|
| 5,399,379 A | 3/1995 | Sandhu | 427/255.2 |
| 5,420,072 A | 5/1995 | Fiordalice et al. | 437/192 |
| 5,421,974 A | 6/1995 | Witt | 204/192.25 |
| 5,429,972 A | 7/1995 | Anjum et al. | 437/47 |
| 5,445,999 A | 8/1995 | Thakur et al. | 437/242 |
| 5,492,854 A | 2/1996 | Ando | 437/60 |
| 5,521,112 A | 5/1996 | Tseng | 437/52 |
| 5,547,890 A | 8/1996 | Tseng | 437/52 |
| 5,554,557 A | 9/1996 | Koh | 437/52 |
| 5,563,088 A | 10/1996 | Tseng | 437/52 |
| 5,583,070 A | 12/1996 | Liao et al. | 437/52 |
| 5,595,928 A | 1/1997 | Lu et al. | 437/52 |
| 5,597,754 A | 1/1997 | Lou et al. | 437/52 |
| 5,670,431 A | 9/1997 | Huanga et al. | 437/241 |
| 5,686,345 A | 11/1997 | Harmon et al. | 437/67 |
| 5,691,228 A * | 11/1997 | Ping et al. | 438/255 |
| 5,723,379 A * | 3/1998 | Watanabe et al. | 438/398 |
| 5,754,390 A * | 5/1998 | Sandhu et al. | 361/321.4 |
| 5,796,484 A * | 8/1998 | Honma et al. | 356/371 |
| 5,801,104 A * | 9/1998 | Schuegraf et al. | 438/778 |
| 5,989,973 A * | 11/1999 | Zahurak et al. | 438/398 |

* cited by examiner

METHOD OF FORMING SILICON NITRIDE LAYER DIRECTLY ON HSG POLYSILICON

This application is a Continuation of U.S. Ser. No. 08/734,357, filed Oct. 21, 1996 now abandoned.

FIELD OF THE INVENTION

The present invention relates to the manufacture of semiconductor devices, and in particular to methods and apparatus for thin silicon nitride layers.

BACKGROUND OF THE INVENTION

Silicon nitride is commonly used in the manufacture of semiconductor devices. Silicon nitride is a useful diffusion barrier layer. For example, gate structures in transistors often use such layers to prevent diffusion between the bottom silicon layer and the top conducting layer, such as the metal interconnect layer. Similarly, thin silicon nitride layers are utilized in interconnects between underlying active device regions and the metallization layer. Most commonly, thin layers of silicon nitride are used in semiconductor memories.

Dynamic random access memories (DRAMs) are the most widely used form of semiconductor memory to date. DRAMs are composed of memory cell arrays and peripheral circuitry required for cell access and external input and output. Each memory cell array is formed of a plurality of memory cells for storing bits of data. Typical memory cells are formed of a capacitor, for storing electric charges and a transistor, for controlling charge and discharge of the capacitor. Of primary concern is maximizing the storage capacitance of each memory cell capacitor, particularly in light of the demand for 256 Mb DRAMs today and higher densities in the future without increasing the chip space required to form the cell. In fact, there is a need to decrease the chip space required to form each memory cell. The importance of high density DRAMs can not be overstated in today's competitive microelectronics market. Devices are becoming smaller, but they are required to provide much more performance.

One way to achieve greater capacitance per unit area is to roughen the surface of the capacitor plate, increasing the surface area. As can be seen from the following equation, the most important parameters involved in achieving maximum charge, Q, stored on the capacitor are the thickness of the dielectric layer ($t_{ox}$), the area of the capacitor (A), and the dielectric constant ($\in$). The voltage applied to the gate is $V_g$.

$$Q=(\in \cdot A \cdot V_g)/t_{ox}$$

Increasing the capacitor area by forming the storage capacitor in a trench shape etched in the substrate is well known in the art, as well as using a stacked capacitor structure. Stacked-type capacitors feature a major part of the capacitor extending over the gate electrode and field isolating film of the underlying transistor. Such structures are generally composed of a lower plate electrode (consisting of a base portion a standing wall portion), a capacitor dielectric film, and an upper plate electrode. Other complex topographical lower plate electrode configurations have also been used to maximize the capacitive area of a memory cell, such as fin-type, double-sided, and roughened lower plate electrode structures produced using hemispherical grain (HSG) polysilicon. In addition to increasing the capacitive surface area of a memory cell, as can be seen from the above equation, the capacitor dielectric film must be as thin as possible to maintain the maximum charge stored on the capacitor. However, it must also prevent direct electrical contact between the lower and upper electrodes.

In order to minimize the thickness of the cell dielectric layer and further increase the cell capacitance, silicon nitride is commonly used in such memories due to its superior qualities as compared to silicon oxide (another commonly used dielectric in semiconductor integrated circuit fabrication) at such thicknesses. At thicknesses of 100 angstroms or less, silicon oxide exhibits a high defect density. Silicon oxide is further undesirable for use in memory cells due to its comparatively low dielectric constant While silicon nitride is superior to silicon oxide at thicknesses below 100 angstroms, silicon nitride also has problems of its own. Pinholes, extending throughout a silicon nitride layer, often lead to current leakage, which decreases capacitance and can further degrade devices over time, making them unreliable.

One prior solution to overcoming the pinhole problem is to form a plurality of silicon nitride layers in place of a single layer, chancing the occurrence that pinholes in adjacent layers will not be aligned, thus preventing current leakage. However, this technique is not reliable and its use is limited in today's devices due to the need to make devices as small as possible.

Another problem experienced with using thin layers of silicon nitride in memory cells is obtaining sufficient step coverage of lower electrodes in such cells. As manufacturers are increasing the surface area of the lower electrode to increase cell capacitance, step coverage of such structures is often insufficient, leading to current leakage. Such structures often comprise stacked capacitors, fin-type capacitors, trench capacitors and roughened, double-sided (or simply roughened) lower electrode surfaces, such as hemispherical grain (HSG) polysilicon. The complex topographies of these structures present step coverage problems as devices are scaled down in size. Silicon nitride's affinity for depositing on silicon in comparison to other surrounding materials, such as insulator materials, further complicates the step coverage problem when topographies are composed of heterogenous materials.

To date, deposition of silicon nitride films has occurred at temperatures of higher than approximately 700 degrees Celsius. A disadvantage of using such high processing temperatures is that it decreases the thermal budget allowed for device formation. Once a thermal budget is consumed, subsequent thermal treatments are likely to degrade device performance. Since many types of materials in semiconductor manufacturing require the use of high processing temperatures for their manufacture, it is critical to minimize consumption of the thermal budget where possible.

A further disadvantage of using such high temperatures is that it is hard to provide a controllable, repeatable deposition process due to the high deposition rate associated with such higher temperatures. It is desirable to deposit thin nitride films in a more controlled, repeatable manner to provide better step coverage of complex topographical structures.

There is a need for a method for forming thin silicon nitride films on complex topographies with a minimum consumption of the thermal budget. In particular, there is a need for forming thin silicon nitride films having sufficient step coverage on such complex topographies. To date, the problem of obtaining sufficient step coverage and uniformity on roughened surfaces in particular has not been resolved. The use of such a rough surface material, HSG polysilicon, is becoming more prevalent, but a method for forming uniform silicon nitride films on HSG has not been found. In addition to the above needs, there is a further need for forming thin silicon nitride films in a way which reduces resulting leaking current in associated devices.

SUMMARY OF THE INVENTION

Silicon nitride films, having thicknesses of 100 angstroms or less, are formed using chemical vapor deposition (CVD). Deposition pressure regimes, which are higher than many prior pressure regimes, are used to provide more uniform step coverage on complex topographies. When using higher pressure regimes, a lower processing temperature is used to beneficially decrease thermal budget consumption and to reduce the deposition rate for achieving a more repeatable and controllable process.

Silicon nitride films, which result in reduced leakage currents for associated devices, are produced in accordance with the method of this invention. By using this invention, a single silicon nitride film may be used in a device since fewer pinholes are present in the film due to the high pressure regime of this invention. Step coverage of complex topographical structures is also greatly improved using this invention. For the first time, the problem of obtaining uniform silicon nitride films on hemispherical grain (HSG) polysilicon is addressed and minimized. This is very advantageous, considering HSG's prevalent use in semiconductor manufacturing. Furthermore, when using this invention to deposit on topographies composed of heterogenous materials, deposition selectivity is minimized.

In one embodiment, a hot wall batch CVD processing apparatus utilizes a processing chamber pressure of at least as high as approximately 500 mTorr to deposit such films. The temperature range used to process such films is approximately 400 to 700 degrees Celsius.

In a second embodiment, a single wafer cold wall CVD processing apparatus utilizes a processing chamber pressure of approximately 1 to 600 Torr to deposit such films. The temperature range used to process such films is approximately 400 to 700 degrees Celsius.

Larger wafers, such as those having diameters of six inches or more, have previously been difficult to form uniform films on. In both embodiments, wafers having diameters of six inches or more are easily deposited. However, any size of wafer can be deposited using the process parameters and method described.

Any type of CVD is used with this invention. A mixture of ammonia ($NH_3$) and dichlorosilane (DCS), or another member of the silane family of gases, are reacted in the CVD apparatus to produce the films.

DESCRIPTION OF THE EMBODIMENTS

Figure 1A:
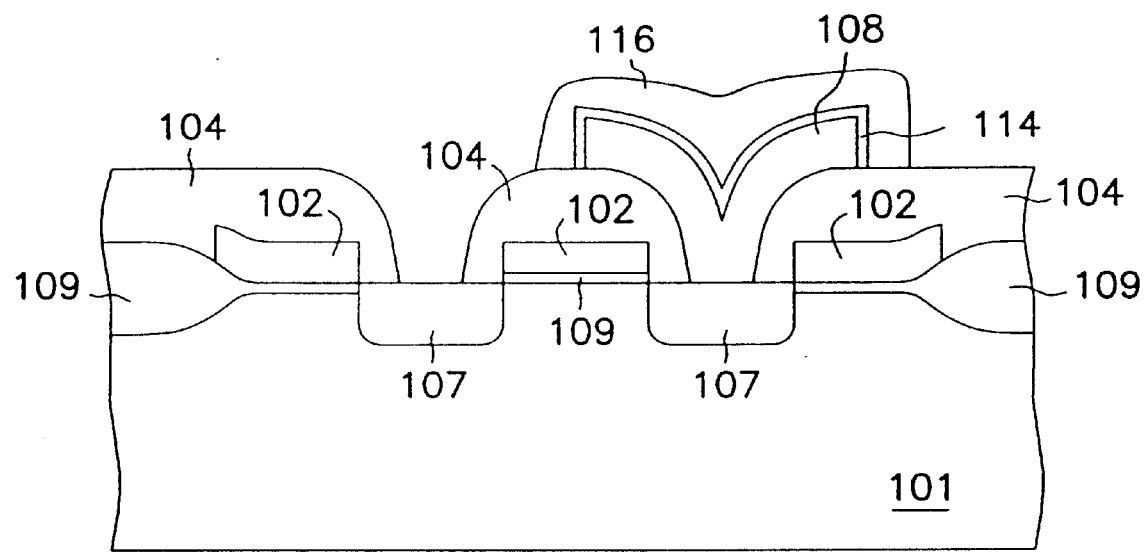
FIGS. 1A to 1F are cross-sectional representations of DRAM capacitor structures having complex topographies, which are beneficially deposited with silicon nitride using the method of the invention.

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized and that structural, logical and electrical changes may be made without departing from the spirit and scope of the present invention. The following detailed description is, therefore, not to be taken in a limiting sense, and the scope of the present invention is defined by the appended claims. Numbering in the Figures is usually done with the hundreds and thousands digits corresponding to the figure number, with the exception that the same components may appear in multiple figures.

Silicon nitride is formed in a semiconductor integrated circuit according to the method of this invention when thin (thicknesses of 100 angstroms or less) layers of silicon nitride are needed. This invention is particularly useful for forming silicon nitride films having thicknesses of 80 angstroms or less. A high pressure deposition regime is used to provide more uniform step coverage on complex topographies at lower processing temperatures.

Due to the majority of applications for such a thin nitride film being in the fabrication of memory cells, the method will be described in reference to forming a common memory cell, such as a dynamic random access memory (DRAM) cell. Topographies on which silicon nitride must be deposited in such cells vary widely. For example, stacked, trench, fin, and double-sided structures provide an increased surface area for lower electrodes in such memory cells. Furthermore, roughened electrode surfaces, such as those produced when using HSG polysilicon create step coverage problems when using conventional chemical vapor deposition (CVD) techniques. It should also be recognized that silicon nitride diffusion barrier layers in transistor gate structures and in metallization interconnect layers, among other integrated circuit uses, may also be formed using this invention. This invention is further applicable to forming a silicon nitride film whether or not the underlying topographies are doped, undoped, rugged, or smooth.

When using this invention to deposit on topographies composed of heterogenous materials, problematic deposition selectivity is minimized. Selectivity between deposition on materials in the silicon family (i.e., doped or undoped silicon, amorphous silicon, and polysilicon) and other materials, such as insulators, is minimized.

Memory cells and other devices formed with silicon nitride according to the method of the invention exhibit superior electrical performance, having a reduction in leakage current among other properties. As compared to previously used techniques, a single silicon nitride film may be used since fewer pinholes are present. Instead, the higher pressure regime of this invention efficiently minimizes pinholes present in such films.

Figure 1B:
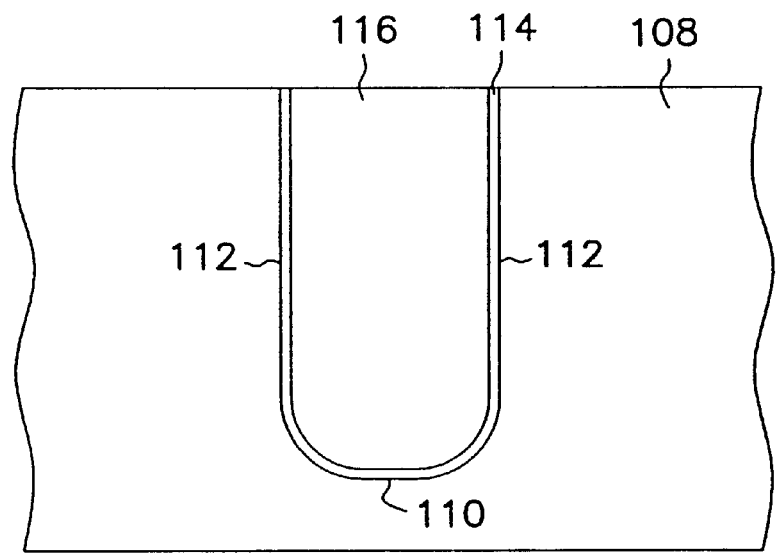
Figure 1C:
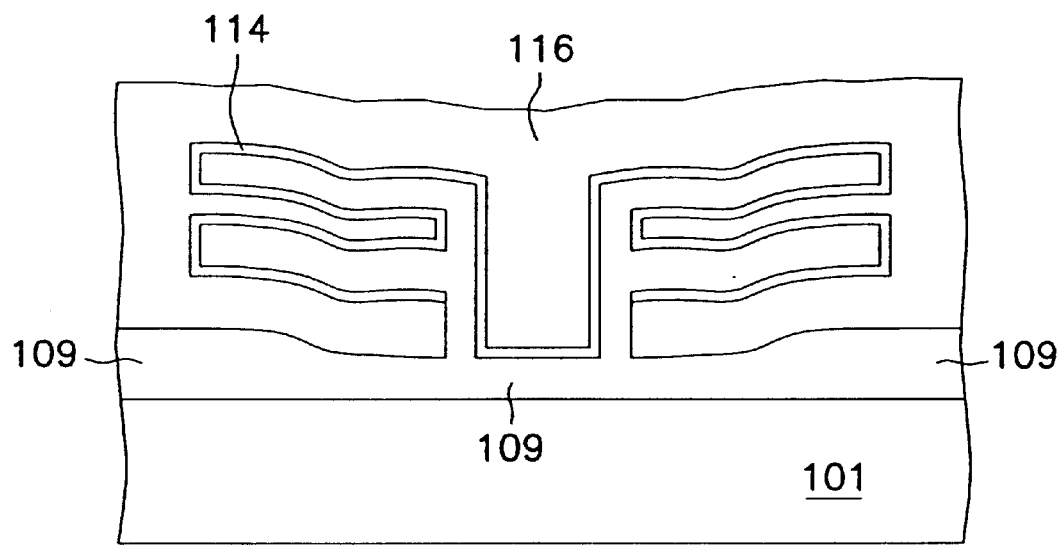
Figure 1D:
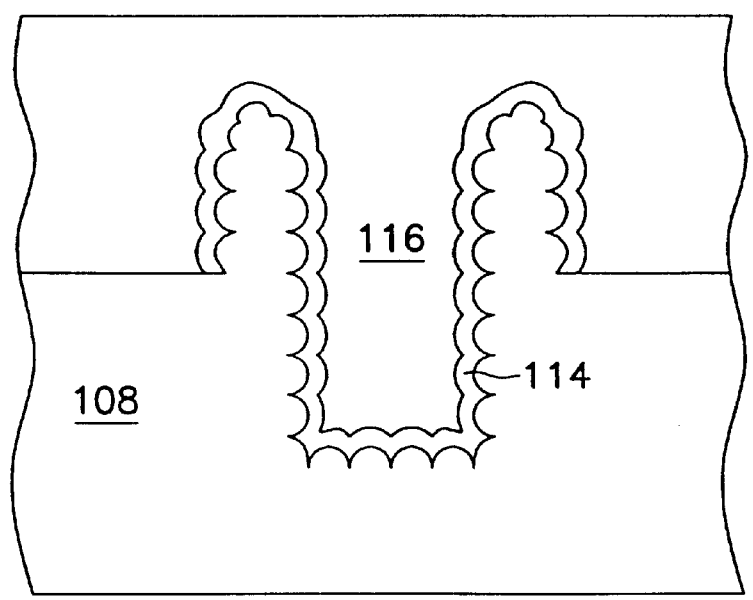
Figure 1E:
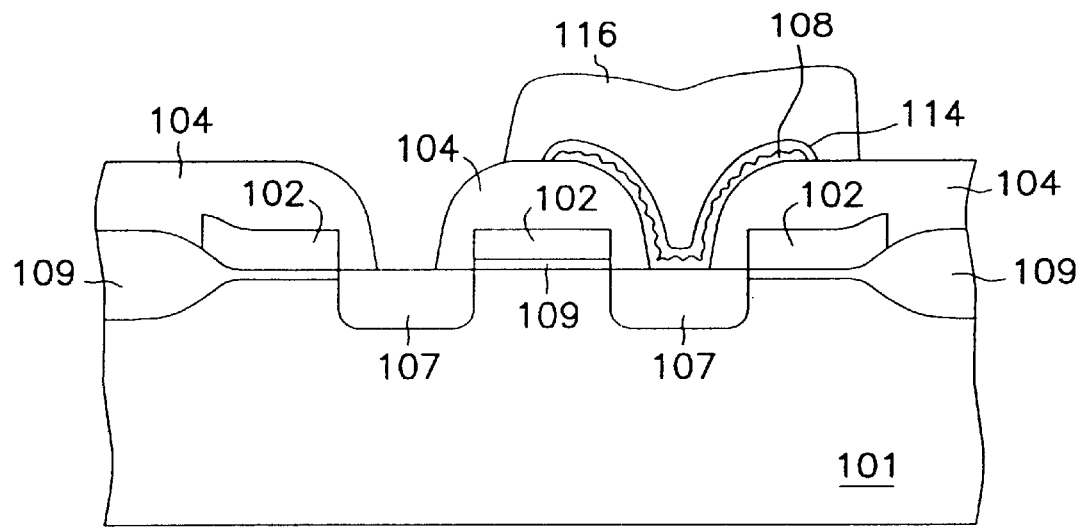
Figure 1F:
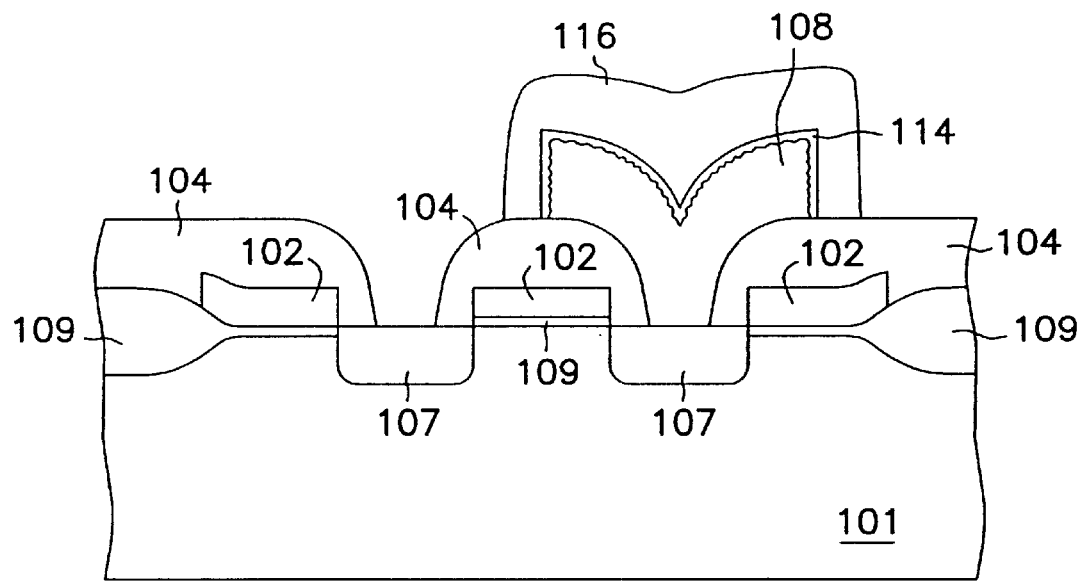

One type of structure utilizing the invention is a stacked-type capacitor, a modified one of which is shown in FIG. 1A. Such a capacitor features a major part of the capacitor extending over a gate electrode 102 and field isolating film 104 of an underlying transistor. The field isolating film 104 typically comprises borophosphosilicate glass (BPSG), as it is easily reflowed to produce rounded corners, enabling better step coverage of complex topographical structures, such as the gate electrode 102 or contact openings extending over the source/drain regions 107 of the transistor. Each transistor is isolated from adjacent devices with field oxide 109, which also forms the gate oxide 109 using a process such as Local Oxidation of Silicon (LOCOS). The capacitor lower plate electrode 108 consists of a base portion 110 and a standing wall portion 112. A silicon nitride film 114 is formed in accordance with the method of the invention between the lower plate electrode 108 and an upper plate electrode 116. Other memory cell structures formed using the method of the invention are shown in FIGS. 1B, 1C, 1D, 1E, and 1F. FIG. 1B illustrates a trenched capacitor structure. FIG. 1C illustrates a fin-type capacitor structure. FIG. 1D illustrates a trenched, double-sided capacitor structure having a roughened lower plate electrode 108, such as produced using hemispherical grain (HSG) polysilicon for the lower plate electrode 108. FIG. 1E illustrates a single-sided, stacked-type capacitor structure having a roughened lower plate electrode 108. FIG. 1F illustrates a double-sided, stacked-type capacitor structure having a roughened lower plate electrode 108.

In one embodiment, hot wall batch CVD processing chambers utilize pressures of at least as high as approximately 500 mTorr to deposit such films 114, as shown in FIGS. 1A to 1D. The temperature range used to process such films 114 is approximately 400 to 700 degrees Celsius. A plurality of semiconductor wafers, preferably having a diameter of six inches or greater, are fabricated such that a multiplicity of lower plate electrode structures 108 are created for a memory array, as well known to one skilled in the art. However, such larger wafers need not be used to practice the invention, but merely illustrate the beneficial uses of the method. As stated previously, this invention is described with reference to forming a memory cell. Thus, the silicon nitride film 114 is deposited on a lower plate electrode 108, having a topography as previously described. The lower plate electrode 108 is typically prepared with hydrofluoric acid (HF) in either a standard tank or HF vapor cluster to the furnace in order to hydrogen-passivate the lower plate electrode 108. However, when depositing a silicon nitride film 114 on a surface of another type, surface preparation procedures are changed accordingly.

The processing chamber is purged with nitrogen gas and evacuated. Then, the pressure of the processing chamber is brought to at least as high as approximately 500 mTorr and the temperature of the chamber is brought to approximately 400 to 700 degrees Celsius. Ammonia ($NH_3$) and dichlorosilane (DCS) are then reacted in the processing chamber at a ratio of approximately 3:1 to 20:1 to deposit silicon nitride 114 on the lower plate electrodes 108 of the memory cells, representative shapes of which are shown in FIGS. 1A to 1F. However, other members of the silane family of gases, such as silane, disilane, or other halosilanes, can be used in place of DCS for the reactant gases. In one example, a processing chamber pressure of approximately 1,500 mTorr and a temperature of approximately 645 degrees Celsius is used. $NH_3$ and DCS are reacted in a ratio of approximately 5:1. The reactant gases, $NH_3$ and DCS are flowed for approximately up to 20 to 30 minutes to form a silicon nitride film 114 of the desired thickness. After forming the silicon nitride film 114, an optional reoxidation step is performed in a wet or dry oxidizing ambient at approximately 600 to 900 degrees Celsius, as well known to one skilled in the art.

Figure 2:
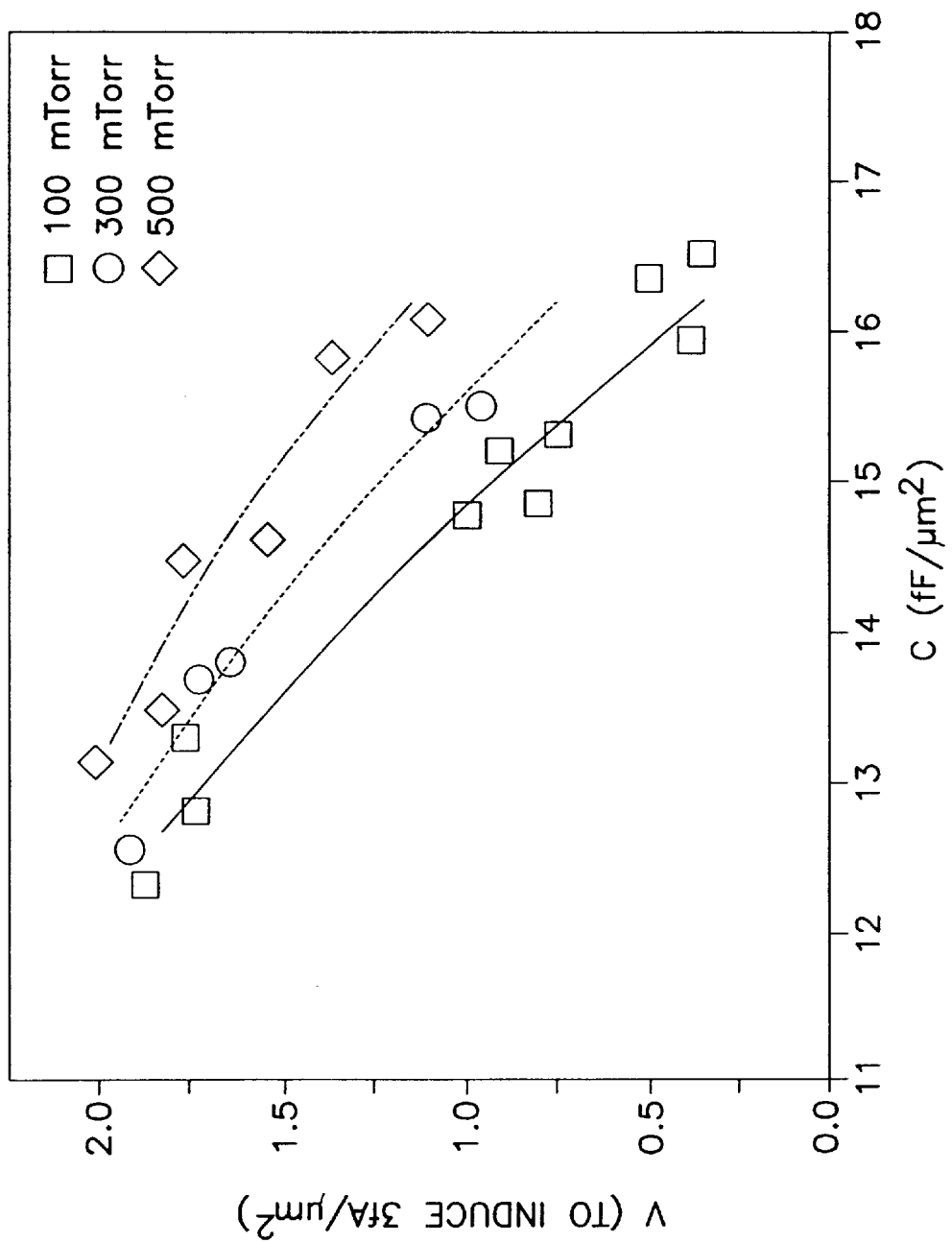
FIG. 2 is a graphical representation of experimental results of capacitance versus applied voltage, illustrating the effect of using a high pressure regime to form thin silicon nitride films in accordance with the method of the invention, as compared with previously used pressure regimes.

FIG. 2 shows experimental results obtained using such a high pressure regime to form a more uniform silicon nitride film 114 on a HSG surface 108, having the type of roughened surface topography of which is shown in FIGS. 1D to 1F, as compared to previously used lower pressure regimes. The silicon nitride films 114 were deposited on planar capacitors formed on a tetraethyloxysilicate (TEOS) carpet layer, as well known to one skilled in the art, prior to testing. Film capacitance is plotted versus the voltage applied to induce such a capacitance. The voltages shown are those needed to produce a current flux of 3 $fA/\mu m^2$ throughout the film 114. It is desirable for an applied voltage to produce as high a capacitance value as possible. The thickness of the silicon nitride films 114 produced to show the results in FIG. 2 was approximately 50 to 70 angstroms. The deposition temperature was 680 degrees Celsius and the ratio of $NH_3$:DCS was 6:1. Accordingly, for a given voltage (V), higher capacitance (C) is achieved across a silicon nitride film 114 produced using the method of the invention, as compared to previously used pressure regimes such as 100 mTorr and 300 mTorr regimes.

Figure 3:
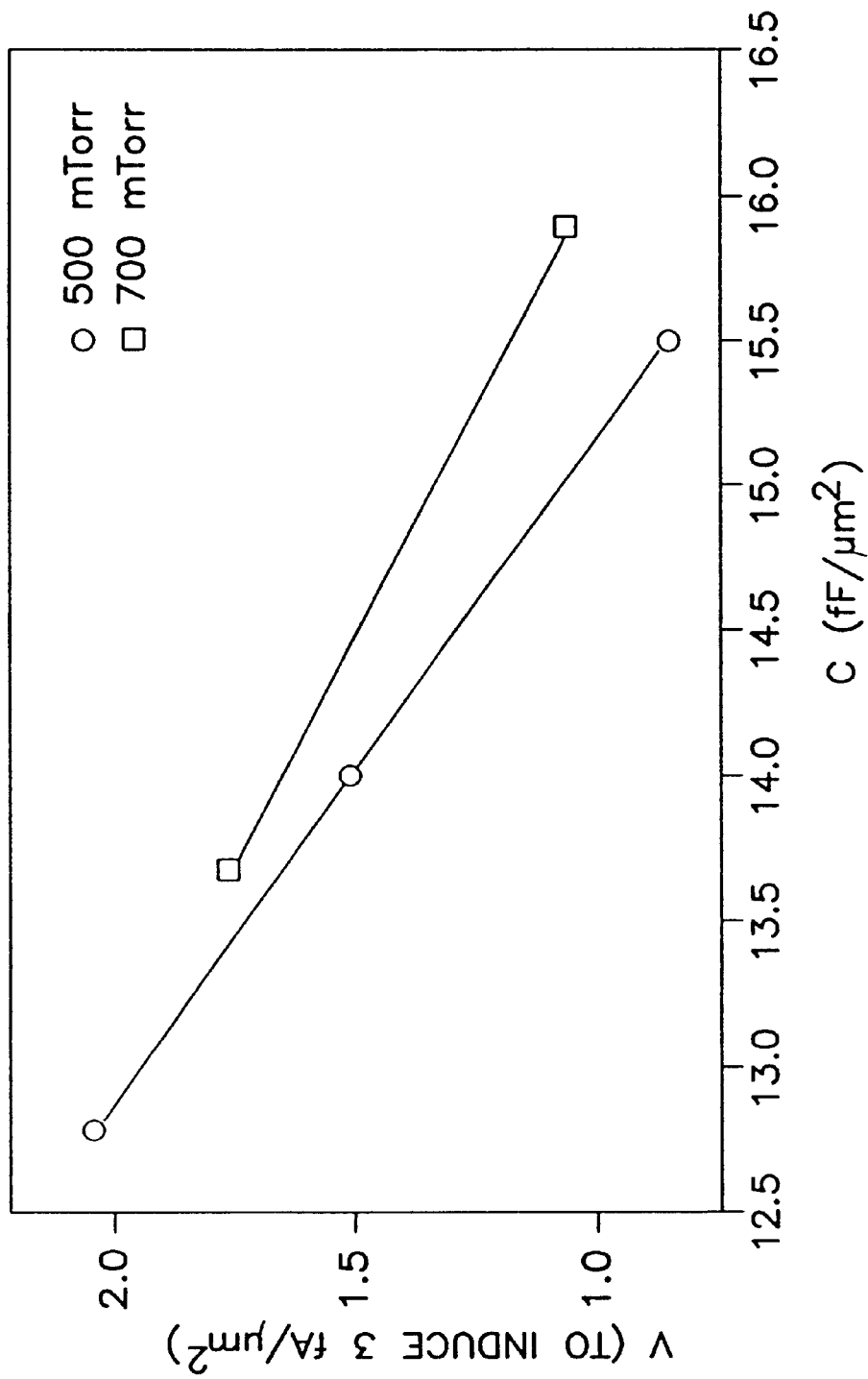
FIG. 3 is a graphical representation of further experimental results of capacitance versus applied voltage, illustrating the effects of increasing the processing chamber pressure within the pressure regime of this invention.

By further increasing the processing chamber pressure within the pressure regime of this invention, electrical properties of resulting devices are further improved. FIG. 3 shows the experimental results obtained from further increasing the processing chamber pressure to 700 mTorr in this embodiment of the invention, as compared with a processing chamber pressure of 500 mTorr illustrated for the silicon nitride films 114 in FIG. 2. Film capacitance is plotted versus the voltage applied to induce such a capacitance. The voltages shown are those needed to produce a current flux of 3 $fA/\mu m^2$ throughout the film 114 deposited on the HSG bottom plate electrode 108, having a roughened surface topography as shown in FIGS. 1D to 1F, described previously with reference to FIG. 2.

Figure 4:
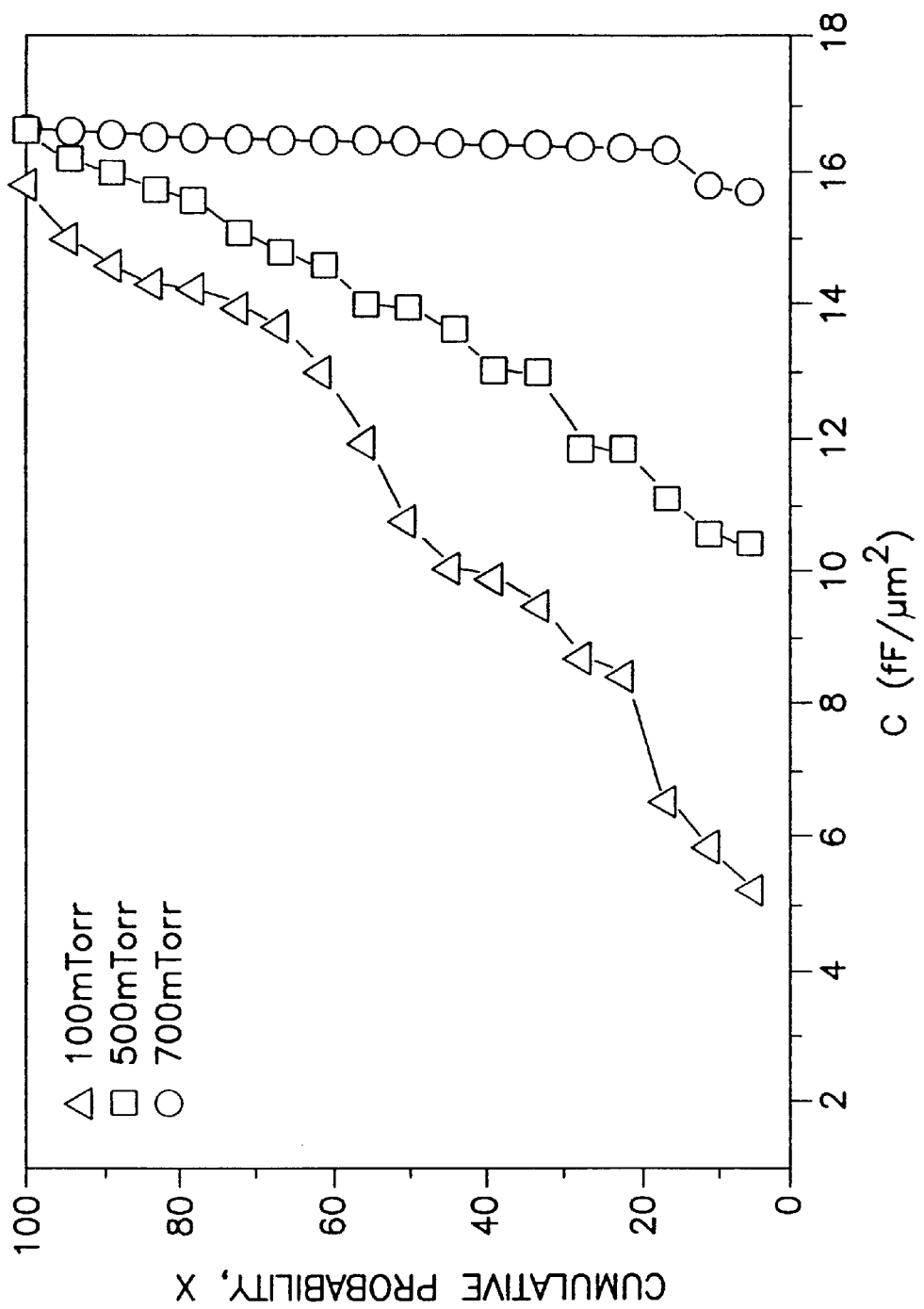
FIG. 4 is a graphical representation of capacitance versus the cumulative probability of a particular capacitance value occurring at random points on a silicon nitride film, illustrating how uniformity of capacitance across silicon nitride films produced according to the method of the invention compares to that of silicon nitride films produced using lower pressure regimes.

As shown in FIG. 4, by using a high pressure regime for depositing a silicon nitride film 114, film uniformities are improved, resulting in a more uniform capacitance across the surface of the film 114. The cumulative probability, X, of a particular capacitance value occurring at any point on a silicon nitride film 114 is plotted versus particular capacitance, C, values. The results shown in FIG. 4 correspond to 50 angstrom silicon nitride films 114 formed on HSG surfaces 108, having a roughened surface topography as shown in FIGS. 1D to 1F. The films 114 were subjected to a 100 angstrom reoxidation step at 800 degrees Celsius after their formation. Film uniformities, showing deviations of less than two angstroms, are seen across silicon nitride films 114 deposited in accordance with the method of the invention.

Such results are meant to be illustrative generally of the effects of forming such silicon nitride films 114 using a high pressure regime. The results, as shown in FIGS. 2, 3, and 4 may not be repeatable, depending on ones equipment, the nature of the topography on which the film 114 is deposited, and other parameters. However, the general principle of the results will be the same. By forming thin silicon nitride films 114 using a higher pressure regime, film properties are improved. Furthermore, lower processing temperatures are used to form the films 114, resulting in a desirably decreased thermal budget and a reduced deposition rate, which advantageously provides a more repeatable, controllable process.

In a second embodiment, a single wafer cold wall CVD processing apparatus utilizes a processing chamber pressure of approximately 1 to 600 Torr to deposit such films 114, as shown in FIGS. 1A to 1F. After preparing the surface 108, on which the silicon nitride film 114 is to be deposited, the temperature of the wafer table in the corresponding processing chamber is brought to approximately 400 to 700 degrees Celsius. Ammonia ($NH_3$) and dichlorosilane (DCS) are then reacted in the processing chamber at a ratio of approximately 3:1 to 20:1 to deposit silicon nitride 114 on the lower plate electrodes 108 of the memory cells, or another surface as desired. However, as noted for the first embodiment, another member of the silane family of gases can be used instead of DCS for the reactant gases. In one example, a processing chamber pressure of approximately and a temperature of approximately 645 degrees Celsius is used. $NH_3$ and DCS are reacted in a ratio of approximately 5:1.

In both embodiments, wafers having diameters of six inches or more are easily deposited. Larger wafers, such as those having diameters of six inches or more, have previously been difficult to form uniform films 114 on. However, any size of wafer can be deposited using the process parameters and method described. It is also to be understood that any type of CVD can be used with this invention. For example, low pressure chemical vapor deposition (LPCVD), rapid thermal chemical vapor deposition (RTCVD) and plasma-type CVD chambers can be used. When forming a memory cell, subsequent processing steps comprise forming an upper plate electrode 116, as well known to one skilled in the art.

It is to be understood that the above description is intended to be illustrative, and not restrictive. Many other embodiments will be apparent to those of skill in the art upon reviewing the above description. For example, the shape of the storage electrode 108 over which a silicon nitride film 114 is formed can be different than those previously mentioned. The substrate on which such a film 114 is deposited may be a plain cubic structure, a cylindrical structure, a fin-type structure (as shown in FIG. 1C), a roughened surface (as shown in FIGS. 1D to 1F), a double-sided structure (as shown in FIGS. 1D and 1F), a trench-type structure (as shown in FIGS. 1A and 1B), or a stacked-type structure (as shown in FIGS. 1A, 1E, and F), to name just a few, when forming the silicon nitride film 114 in a memory cell. Furthermore, the substrate over which the silicon nitride film 114 is formed need not have a complex topography. The invention is applicable to the formation of thin silicon nitride films 114 on smooth substrate surfaces as well. Thin silicon nitride films 114 formed in accordance with the method of the invention can be formed anywhere such a film 114 is needed in a semiconductor integrated circuit without departing from the scope of the invention. Substrates on which such films 114 are deposited can be any type of semiconductor material, including a heterogeneous surface comprising both insulative and conductive materials. It is also to be understood that such substrates can be a multiplicity of layers, such as those present in forming a particular device. The scope of the invention should, therefore, be determined with reference to the appended claims, along with the fill scope of equivalents to which such claims are entitled.

An embodiment of the present invention includes a method for forming a silicon nitride film on a substrate, comprising the steps of: heating the substrate in a chemical vapor deposition processing chamber to a temperature of approximately 400 to 650 degrees Celsius; and reacting ammonia and a silane gas in the processing chamber to form the silicon nitride film on the substrate.

An embodiment of the present invention includes a method for forming a silicon nitride film on a substrate, comprising the steps of: heating the substrate in a hot wall batch chemical vapor processing chamber to a temperature of approximately 400 to 650 degrees Celsius; and reacting ammonia and a silane gas in the processing chamber at a pressure of at least approximately 500 mTorr to form the silicon nitride film on the substrate.

An embodiment of the present invention includes a method for forming a silicon nitride film on a substrate, comprising the steps of: heating the substrate in a chemical vapor deposition processing chamber to a temperature of approximately 400 to 650 degrees Celsius; and reacting ammonia and a silane gas in the processing chamber to form the silicon nitride film, having a thickness of approximately less than 100 angstroms, on the substrate.

What is claimed is:

1. A method for forming a silicon nitride film on a hemispherical grain polysilicon surface, comprising:
   heating the hemispherical grain polysilicon surface in a chemical vapor deposition processing chamber to a temperature of approximately 645 degrees Celsius; and
   reacting ammonia and a silane gas in the processing chamber at a pressure of at least approximately 500 mTorr to form the silicon nitride film directly on the hemispherical grain polysilicon surface.

2. A method for forming a silicon nitride film on a hemispherical grain polysilicon surface, comprising:
   heating the hemispherical grain polysilicon surface in a chemical vapor deposition processing chamber to a temperature of approximately 400 to 645 degrees Celsius; and
   reacting ammonia and a silane gas in the processing chamber at a pressure of at least approximately 500 mTorr to form the silicon nitride film directly on the hemispherical grain polysilicon surface.

3. The method of claim 2, wherein the processing chamber is a hot wall batch processing chamber.

4. The method of claim 2, wherein the processing chamber is a single wafer cold wall processing chamber having a pressure of approximately 1 to 600 Torr.

5. The method of claim 2, wherein the silane gas is selected from the group consisting of silane, disilane and halosilanes.

6. The method of claim 2, wherein the silane gas is dichlorosilane.

7. A method for forming a silicon nitride film on a hemispherical grain polysilicon surface, comprising:
   heating the hemispherical grain polysilicon surface in a hot wall batch chemical vapor deposition processing chamber to a temperature of approximately 400 to 645 degrees Celsius; and
   reacting ammonia and a silane gas in the processing chamber at a pressure of at least approximately 500 mTorr to form the silicon nitride film directly on the hemispherical grain polysilicon surface.

8. The method of claim 7, wherein the silane gas is selected from the group consisting of silane, disilane and halosilanes.

9. The method of claim 7, wherein the silane gas is dichlorosilane.

10. A method for forming a silicon nitride film on a hemispherical grain polysilicon surface, comprising:
    heating the hemispherical grain polysilicon surface in a single wafer cold wall chemical vapor deposition processing chamber to a temperature of approximately 400 to 645 degrees Celsius; and
    reacting ammonia and a silane gas in the processing chamber at a pressure of approximately 1 to 600 Torr to form the silicon nitride film directly on the hemispherical grain polysilicon surface.

11. The method of claim 10, wherein the silane gas is selected from the group consisting of silane, disilane and halosilanes.

12. The method of claim 10, wherein the silane gas is dichlorosilane.

13. A method for forming a silicon nitride film on a hemispherical grain polysilicon surface, comprising:
heating the hemispherical grain polysilicon surface in a chemical vapor deposition processing chamber to a temperature of approximately 400 to 645 degrees Celsius; and
reacting ammonia and a silane gas in the processing chamber to form the silicon nitride film, having a thickness of approximately less than 100 angstroms, directly on the hemispherical grain polysilicon surface.

14. A method for forming a silicon nitride film on a substrate, comprising:
providing a first portion of the substrate with an insulator material and a second portion with a textured polysilicon surface;
heating the substrate in a chemical vapor deposition processing chamber to a temperature of less than 645 and greater than 400 degrees Celsius;
reacting ammonia and a silane gas in a chemical vapor processing chamber at a pressure of approximately 1 to 600 Torr; wherein reacting ammonia and a silane gas includes forming a silicon nitride film having a thickness of less than 80 angstroms directly on the first portion and the second portion.

15. A method for forming a silicon nitride film on a hemispherical grain polysilicon surface, comprising:
heating the hemispherical grain polysilicon surface in a chemical vapor deposition processing chamber to a temperature of approximately 400 to 645 degrees Celsius; and
reacting ammonia and a silane gas in the processing chamber at a pressure of approximately 1 to 600 Torr to form the silicon nitride film directly on the hemispherical grain polysilicon surface.

16. A method for forming a silicon nitride film on a silicon substrate, comprising:
heating the silicon substrate in a chemical vapor deposition processing chamber to a temperature of approximately 400 to 645 degrees Celsius; and
reacting ammonia and a silane gas in the processing chamber at a pressure of approximately 1 to 600 Torr to form the silicon nitride film directly on a hemispherical grain polysilicon surface of the siliconsubstrate.

17. A method for forming a memory cell on a semiconductor substrate, comprising:
forming a lower plate electrode of HSG polysilicon on the substrate;
forming a silicon nitride film directly on a heterogenous surface including lower plate electrode by reacting ammonia and a silane gas in a chemical vapor deposition processing chamber at a temperature of approximately 400 to 645 degrees Celsius and a pressure of approximately 1 to 600 Torr; and
forming an upper plate electrode on the silicon nitride film.

18. The method of claim 17, wherein the silane gas is selected from the group consisting of silane, disilane and halosilanes.

19. The method of claim 17, wherein the silane gas is dichlorosilane.

20. The method of claim 17, wherein the processing chamber is a hot wall batch processing chamber having a pressure of at least approximately 500 mTorr.

21. The method of claim 17, further comprising the step of hydrogen-passivating the lower plate electrode prior to forming the silicon nitride film.

22. A method for forming a memory cell on a semiconductor substrate, comprising:
forming a hemispherical grain polysilicon lower plate electrode on the substrate;
forming a silicon nitride film directly on the hemispherical grain polysilicon lower plate electrode by reacting ammonia and a silane gas in a chemical vapor deposition processing chamber at a temperature of approximately 400 to 645 degrees Celsius and a pressure of approximately 1 to 600 Torr; and
forming an upper plate electrode on the silicon nitride film.

23. The method of claim 22, wherein the silane gas is selected from the group consisting of silane, disilane and halosilanes.

24. The method of claim 22, wherein the silane gas is dichlorosilane.

25. The method of claim 22, wherein the processing chamber is a hot wall batch processing chamber having a pressure of at least approximately 500 mTorr.

26. The method of claim 22, further comprising hydrogen-passivating the lower plate electrode prior to forming the silicon nitride film.

27. A method for forming a silicon nitride film on a hemispherical grain polysilicon surface, comprising:
heating the hemispherical grain polysilicon surface in a hot wall batch chemical vapor deposition processing chamber to a temperature of approximately 645 degrees Celsius; and
reacting ammonia and a silane gas in the processing chamber at a pressure of at least approximately 500 mTorr to form the silicon nitride film directly on the hemispherical grain polysilicon surface.

28. A method for forming a silicon nitride film on a hemispherical grain polysilicon surface, comprising:
heating the hemispherical grain polysilicon surface in a single wafer cold wall chemical vapor deposition processing chamber to a temperature of approximately 645 degrees Celsius; and
reacting ammonia and a silane gas in the processing chamber at a pressure of approximately 1 to 600 Torr to form the silicon nitride film on the hemispherical grain polysilicon surface.

29. A method for forming a silicon nitride film on a hemispherical grain polysilicon surface, comprising:
heating the hemispherical grain polysilicon surface in a chemical vapor deposition processing chamber to a temperature of approximately 645 degrees Celsius; and
reacting ammonia and a silane gas in the processing chamber to form the silicon nitride film, having a thickness of approximately less than 100 angstroms, directly on the hemispherical grain polysilicon surface.

30. A method for forming a silicon nitride film on a substrate, comprising:
providing a first portion of the substrate with an insulator material and a second portion with a textured polysilicon surface;
heating the substrate in a chemical vapor deposition processing chamber to a temperature of 645 degrees Celsius;

reacting ammonia and a silane gas in a chemical vapor processing chamber at a pressure of approximately 1 to 600 Torr; wherein reacting ammonia and a silane gas includes forming a silicon nitride film having a thickness of less than 80 angstroms directly on the first portion and the second portion.

31. A method for forming a memory cell on a semiconductor substrate, comprising:

forming a lower plate electrode of HSG polysilicon on the substrate;

forming a silicon nitride film directly on a heterogenous surface including lower plate electrode of HSG polysilicon by reacting ammonia and a silane gas in a chemical vapor deposition processing chamber at a temperature of approximately 645 degrees Celsius and a pressure of approximately 1 to 600 Torr; and forming an upper plate electrode on the silicon nitride film.

32. A method for forming a memory cell on a semiconductor substrate, comprising:

forming a hemispherical grain polysilicon lower plate electrode on the substrate;

forming a silicon nitride film directly on the hemispherical grain polysilicon lower plate electrode by reacting ammonia and a silane gas in a chemical vapor deposition processing chamber at a temperature of approximately 645 degrees Celsius and a pressure of approximately 1 to 600 Torr; and forming an upper plate electrode on the silicon nitride film.

* * * * *